United States Patent
Zhou et al.

(10) Patent No.: US 7,757,751 B2
(45) Date of Patent: Jul. 20, 2010

(54) HEAT DISSIPATION DEVICE

(75) Inventors: Zhi-Yong Zhou, Shenzhen (CN); Min-Qi Xiao, Shenzhen (CN); Zeng-Jun Gao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 736 days.

(21) Appl. No.: 11/626,716

(22) Filed: Jan. 24, 2007

(65) Prior Publication Data

US 2008/0121371 A1    May 29, 2008

(30) Foreign Application Priority Data

Nov. 29, 2006   (CN) .................... 2006 1 0157119

(51) Int. Cl.
*H05K 7/20* (2006.01)
(52) U.S. Cl. .................... 165/104.33; 361/700
(58) Field of Classification Search ............ 165/104.33; 361/700

See application file for complete search history.

(56) References Cited

U.S. PATENT DOCUMENTS

| | | | | |
|---|---|---|---|---|
| 6,978,829 B1* | 12/2005 | Lin | .................. | 165/104.33 |
| 7,093,648 B1* | 8/2006 | Cheng | .................. | 165/104.33 |
| 7,249,626 B2* | 7/2007 | Hao et al. | .............. | 165/104.33 |
| 7,272,007 B2* | 9/2007 | Lee et al. | .................. | 361/704 |
| 7,385,825 B2* | 6/2008 | Xia et al. | .................. | 361/704 |
| 2005/0098304 A1* | 5/2005 | Lin et al. | .............. | 165/104.33 |
| 2006/0104032 A1* | 5/2006 | Lee et al. | .................. | 361/700 |
| 2006/0203451 A1* | 9/2006 | Wei et al. | .................. | 361/700 |
| 2006/0279926 A1* | 12/2006 | Koo | .................. | 361/700 |
| 2007/0284084 A1* | 12/2007 | Lin | .................. | 165/104.33 |
| 2008/0055854 A1* | 3/2008 | Zhou et al. | .................. | 361/700 |

FOREIGN PATENT DOCUMENTS

| | | |
|---|---|---|
| CN | 2678135 Y | 2/2005 |
| CN | 2757329 Y | 2/2006 |
| CN | 2824514 Y | 10/2006 |
| TW | M249443 | 11/2004 |
| TW | M281394 | 11/2005 |
| TW | M282477 | 12/2005 |

* cited by examiner

*Primary Examiner*—Leonard R Leo
(74) *Attorney, Agent, or Firm*—Jeffrey T. Knapp

(57) ABSTRACT

A heat dissipation device includes a base including a base plate made of a first heat conductive material and a substrate made of a second heat conductive material having a heat conductivity lower than that of the first heat conductive material. The substrate comprises a frame with a window receiving the base plate therein and an engaging plate spanning over the window. A fin set includes a plurality of fins parallel with and spaced from each other, and is mounted on the base. A heat pipe has an evaporating section sandwiched between the base plate and the engaging plate, and two condensing sections extending through the fin set and thermally connecting therewith. The evaporating section has a substantially V-shaped configuration.

20 Claims, 3 Drawing Sheets

HEAT DISSIPATION DEVICE

BACKGROUND OF THE INVENTION

1. Field of the Invention

The present invention relates generally to heat dissipation devices, and more particularly to a heat dissipation device for cooling a heat-generating electronic device.

2. Description of Related Art

With advancement of computer technology, electronic devices operate at a high speed. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device.

Typically, the heat dissipation device comprises a base formed from aluminum and contacting with the electronic device, a plurality of fins parallel to the base and three U-shaped heat pipes thermally connecting the base and the fins together. The heat pipes each comprise an evaporator embedded in a top surface of the base and two condensers extending through the fins. Heat absorbed from the electronic device by the base is transferred to the fins via the heat pipes, and then dissipated to ambient air to positively cool down the heat electronic device. However, the heat dissipating efficiency of the heat dissipation device is determined mostly by heat conductivity of the based; as a result, the base made of a material having comparatively low conductivity such as aluminum unduly affects a performance of the dissipating efficiency of the heat dissipation device. Obviously, to improve the heat dissipating efficiency, the base can be made of a material having comparatively high conductivity such as copper; but to replace the whole base with a copper one would increase the cost and the weight of the heat dissipation device significantly.

What is needed, therefore, is a heat dissipation device having an outstanding capability of heat dissipation whilst cost and weight thereof do not increase too much.

SUMMARY OF THE INVENTION

A heat dissipation device includes a base including a base plate made of a first metal and a substrate made of a second metal. The second metal has a lower heat conductivity and a lower cost than those of the first metal. The substrate comprises a frame with a window receiving the base plate therein and an engaging plate spanning over the window. A fin set includes a plurality of fins parallel with and spaced from each other. A heat pipe has an evaporating section thermally sandwiched between the base plate and the engaging plate, and two condensing sections thermally extending through the fin set. The evaporating section of the heat pipe is bent to have a substantially V-shaped configuration, whereby the heat pipe and the base plate can have an increased contacting area therebetween, to thereby promote the heat absorption of the heat pipe from the base plate. The base plate has a bottom surface for engaging with a heat-generating electronic component.

Other advantages and novel features will become more apparent from the following detailed description of preferred embodiments when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
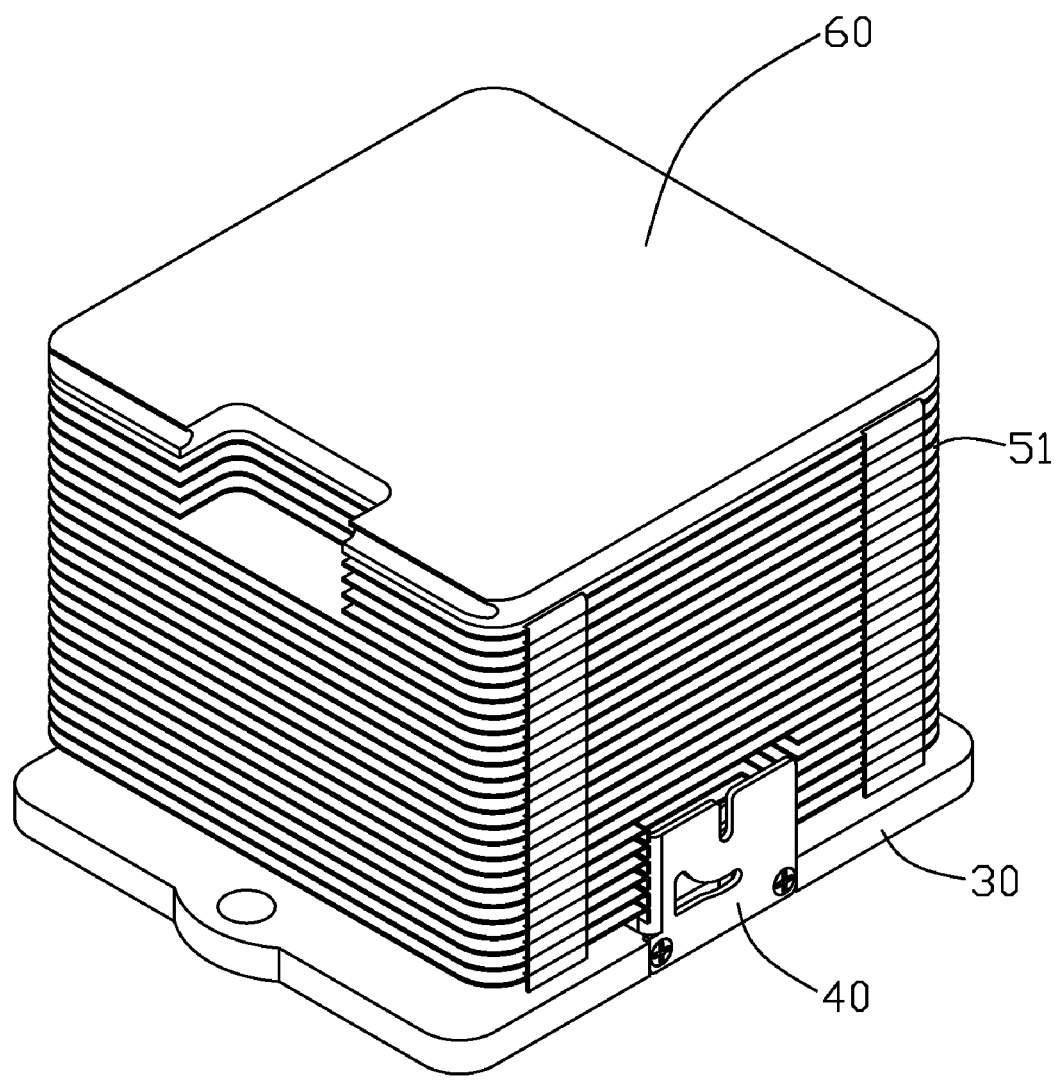
FIG. 1 is an assemble view of a heat dissipation device in accordance with a preferred embodiment of the present invention.
Figure 2:
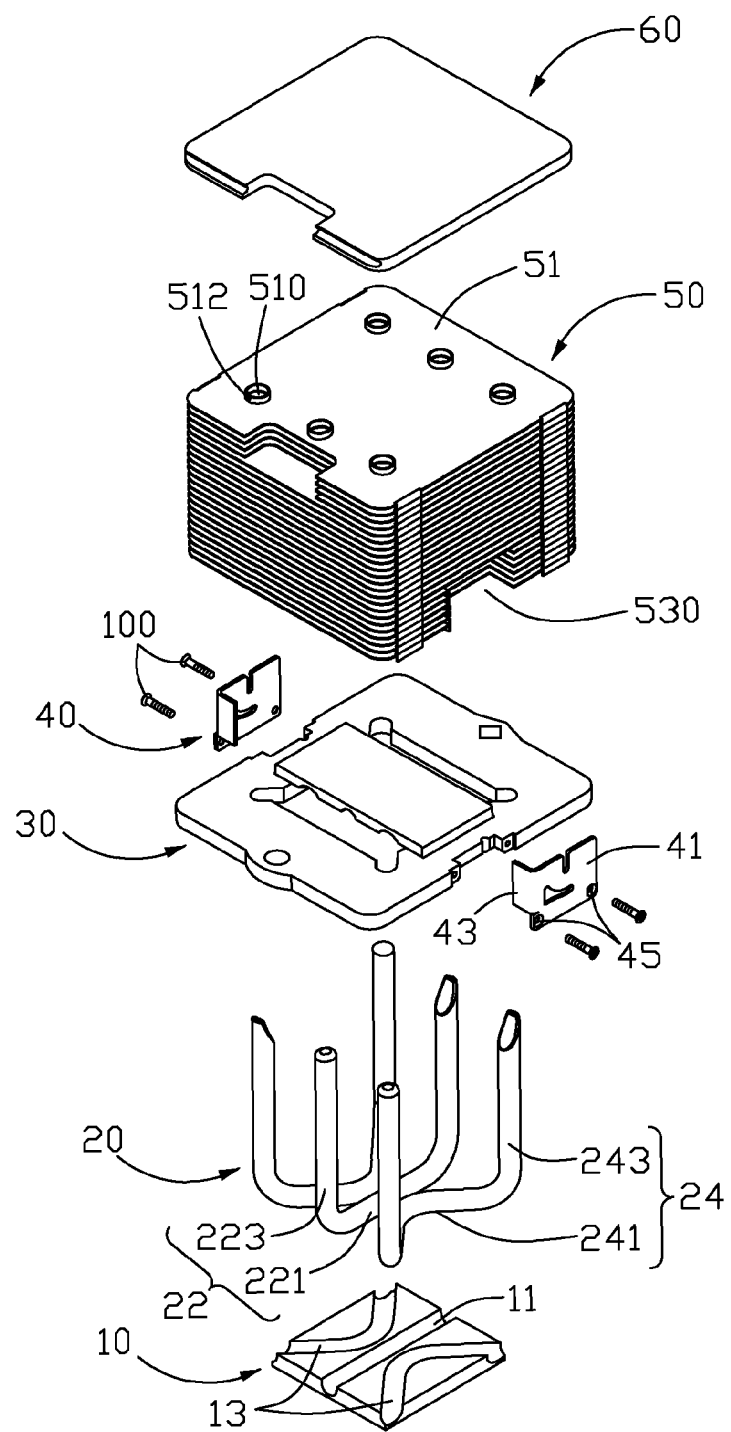
FIG. 2 is an exploded view of the heat dissipation device in FIG. 1.

Referring to FIGS. 1 and 2, a heat dissipation device in accordance with a preferred embodiment of the present invention is utilized to dissipate heat originated by a heat-generating component (not shown). The heat dissipation device comprises a base consisting of a substrate 30 and a base plate 10, three heat pipes 20, two clamping pads 40 secured on two lateral sides of the substrate 30 of the base, a fin set 50 and a top plate 60 located on a top of the fin set 50. The substrate 30 cooperates with the base plate 10 to sandwich portions of the heat pipes 20 therebetween.

The base plate 10 is made of a metallic material with an outstanding heat conductivity, such as copper, and is rectangular in shape. The base plate 10 has a bottom surface for contacting with the heat-generating component, and defines a first groove 11 and two second grooves 13 in a top surface thereof. The first groove 11 is linear in shape and located at a middle of the base plate 10; the second grooves 13 are substantially V-shaped, symmetrically disposed at two opposite sides of the first groove 11 and with openings thereof facing outwards. In other words, the second grooves 13 are separated from each other by the first groove 11.

The heat pipes 20 includes a first heat pipe 22 and two second heat pipes 24. The first heat pipe 22 is substantially U-shaped in profile, and comprises a linear evaporating section 221 embedded in the first groove 11 of the base plate 10 and two vertical condensing sections 223 bent upwards from two opposite ends of the evaporating section 221. Each second heat pipe 24 comprises a V-shaped evaporating section 241 embedded in the second groove 13 of the base plate 10 and two vertical condensing sections 243 bent upwards from two ends of the evaporating section 241. Both the condensing sections 223, 243 of the first and second heat pipes 22, 24 extend through the fin set 50.

Figure 3:
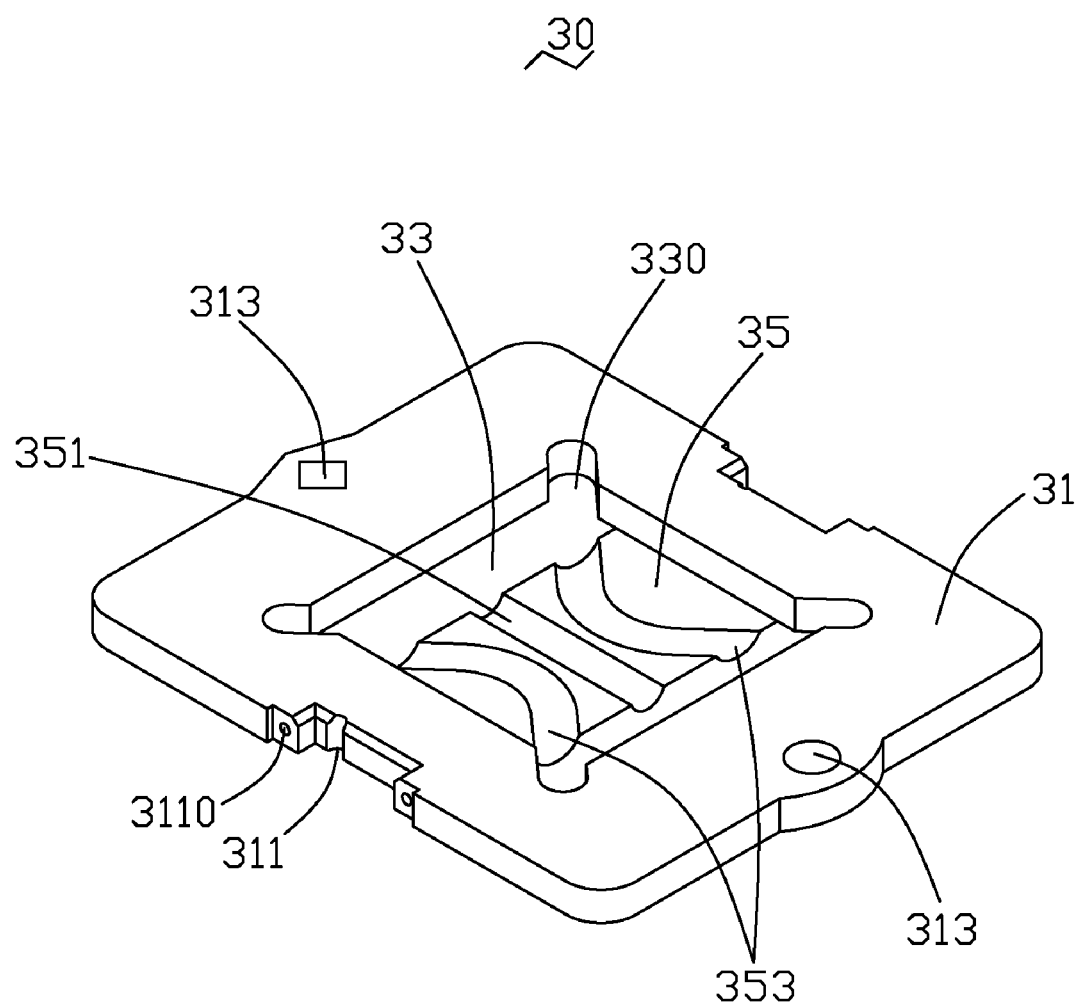
FIG. 3 is an inverted and isometric view of a substrate of the heat dissipation device shown in FIG. 2.

Also referring to FIG. 3, the substrate 30 is made of a metallic material with a heat conductivity lower than that of copper for forming the base plate 10, such as aluminum, which is cheaper than copper and has a density less than that of copper for forming the base plate 10 so as to reduce both the total weight and cost of the heat dissipation device. The substrate 30 comprises a rectangular frame body 31 defining a window 33 in a central area thereof and an engaging plate 35 spanning over the window 33. The window 33 has a rectangular shape consistent with that of the base plate 10, for snugly receiving the base plate 10 therein. The engaging plate 35 defines a first groove 351 and two second grooves 353 on a bottom surface thereof respectively corresponding to the first and second grooves 11, 13 of the base plate 10. The first and second grooves 351, 353 of the engaging plate 35 cooperate with the first and second grooves 11, 13 of the base plate 10 to form channels for accommodating the evaporating sections 221, 241 of the heat pipes 22, 24 therein, respectively. The window 33 of the frame body 31 defines a recess 330 in each corner thereof for allowing the condensing sections 243 of the second heat pipes 24 to pass therethrough. Middle portions of two opposite edges of the frame body 31 protrude outwardly and each defines a positioning hole 313 therein for mounting the substrate 30 on the heat-generating electronic component. Middle portions of another two opposite lateral edges of the frame body 31 recess inwards to define two positioning notches 311, respectively. Two fixing holes 3110 are defined in two opposite ends of each notch 311.

The clamping pads 40 have lower portions fixed in the notches 311 of the substrate 31, respectively. The clamping pad 40 is substantially rectangular and defines two through apertures 45 in two lower corners thereof. Two bolts 100 extend through the apertures 45 of the clamping pad 40 and screw in the fixing holes 3110 of the substrate 30 to fix the clamping pad 40 in the notch 311 of the substrate 30. A tab 43 perpendicularly extends toward the fin set 50 from a lateral edge of the clamping pad 40, and is located above substrate 30.

The fin set 50 comprises a plurality of fins 51 horizontally stacked one by one along a vertical direction. The fin set 50 defines three pairs of channels 510 thermally accommodating the condensing sections 223, 243 of the heat pipes 22, 24 therein. The fins 51 each define an annular flange 512 extending perpendicularly from an edge of the channel 510 for enlarging the engagement area of the fins 51 with the heat pipes 22, 24. Corresponding to the pads 40, the fin set 50 defines two cutouts 530 in lower portions of middles of two opposites sides thereof. The cutouts 530 are in communication with the corresponding notches 311 of the substrate 30. The tabs 43 of the pads 40 are received in corresponding cutouts 530 of the fin set 50 and abut the fin set 50, thereby reinforcing the intensity of the fin set 50. The top plate 60 is thermally located on the fin set 50.

As described above, the base plate 10 is secured in the window 33 of the substrate 30 by soldering with the bottom surface of the engaging plate 35. The evaporating sections 221, 241 of the first and second heat pipes 22, 24 are thermally attached to the base plate 10 and sandwiched between the engaging plate 35 and the base plate 10; the condensing section 221, 241 of the first and second heat pipes 22, 24 extend upwardly beyond the window 33 of the substrate 30 and through the fin set 50.

In operation, the base plate 10 made of copper with high heat conductivity contacts with and absorbs heat from the heat-generating electronic component. Thus, heat generated by the heat-generating electronic component is transferred from the base plate 10 to the fin set 60 directly via the heat pipes 22, 24. Thus, the base including the base plate 10 and substrate 30 is lighter and comparatively less expensive than the base which is wholly made of copper. Meanwhile, the base in accordance with the present invention can effectively absorb the heat from the heat-generating electronic component and transfer it to the heat pipes 22, 24. In addition, by the design of the evaporating sections 241 of the heat pipes 24 which are substantially V-shaped, a contacting area between the heat pipes 24 and the base plate 10 can be increased, whereby heat absorbed by the base plate 10 from the electronic component can be quickly transferred to the heat pipes 24 and the fin set 50. Finally, by the design that the evaporating sections 221, 241 of the heat pipes 22, 24 are sandwiched between the base plate 10 and the engaging plate 35 of the substrate 30, a reliable contact between the evaporating sections 221, 241 of the heat pipes 22, 24 and the base plate 10 can be ensured. Thus, heat of the base plate 10 can be reliably absorbed by the evaporating sections 221, 241 of the heat pipes 22, 24.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
    a base comprising a base plate having a bottom surface adapted for contacting with a heat-generating electronic component and a substrate;
    a fin set comprising a plurality of horizontally stacked fins parallel with and spaced from each other, the fin set defining two cutouts in lower portions of middles of two opposites sides thereof;
    at least one heat pipe thermally connecting the base and the fin set together; and
    two clamping pads attached to two opposite edges of the substrate, each of the clamping pads having a tab extending toward the fin set from a lateral edge of each of the clamping pads, the tab of each of the clamping pads being received in a corresponding cutout of the fin set and abutting a lateral side of the fin set in the corresponding cutout, thereby reinforcing the intensity of the fin set;
    wherein the base plate is made of a material that has higher heat conductivity than that of the substrate, and the at least one heat pipe has an evaporating section sandwiched between the base plate and the substrate.

2. The heat dissipation device of claim 1, wherein the base plate is made of copper and the substrate is made of aluminum.

3. The heat dissipation device of claim 2, wherein the substrate comprises a frame body and an engaging plate, the frame body defines a window in a centre thereof, the engaging plate spans on the window, and the base plate is snugly received in the window.

4. The heat dissipation device of claim 3, wherein the at least one heat pipe is substantially U-shaped, the evaporating section of the at least one heat pipe being sandwiched between the base plate and the engaging plate, the at least one heat pipe further comprising two condensing sections bent perpendicularly from two opposite ends of the evaporating section.

5. The heat dissipation device of claim 4, wherein a top surface of the base plate and a bottom surface of the engaging plate of the substrate each define at least one groove for cooperatively receiving the evaporating section of the at least one heat pipe therein.

6. The heat dissipation device of claim 4, further comprising another two second heat pipes each having a V-shaped evaporating section and two condensing sections extending perpendicularly from two ends of the evaporating section thereof, the condensing sections extending through the fins that are arranged on and parallel to the substrate.

7. The heat dissipation device of claim 6, wherein a top surface of the base plate and a bottom surface of the engaging plate of the substrate each define a straight groove and two V-shaped grooves symmetrically oriented relative to each other at opposite sides of the straight groove for cooperatively receiving the evaporating sections of the heat pipes therein, respectively.

8. The heat dissipation device of claim 6, wherein the window of the frame body defines a recess in each corner thereof for allowing the condensing sections of the two second heat pipes to pass therethrough.

9. The heat dissipation device of claim 4, wherein the base plate is substantially rectangular in shape, consistent with that of the window of the substrate.

10. The heat dissipation device of claim 1, wherein the tabs of the clamping pads are located above the substrate and perpendicularly extend toward the fin set from the lateral edges of the clamping pads.

11. The heat dissipation device of claim 1, wherein the fin set has a plurality of flanges at the lateral sides of the fin set in the corresponding cutouts to engage the tabs of the clamping pads.

12. A heat dissipation device comprising:
a base comprising a base plate made of a first metal and adapted for engaging with a heat-generating electronic component and a substrate made of a second metal having a heat conductivity lower than that of the first metal, the substrate comprising a frame with a window receiving the base plate therein and an engaging plate spanning over the window;
a fin set comprising a plurality of horizontally stacked fins parallel with and spaced from each other, the fin set defining two cutouts in lower portions of middles of two opposites sides thereof;
a heat pipe having an evaporating section sandwiched between the base plate and the engaging plate, and two condensing sections thermally extending through the fin set; and
two clamping plates attached to two opposite edges of the substrate, each of the clamping plates having a tab extending toward the fin set from a lateral edge of the clamping plate, the tab of each of the clamping plates being received in a corresponding cutout of the fin set and engaging with a lateral side of the fin set in the corresponding cutout, thereby reinforcing the intensity of the fin set.

13. The heat dissipation device of claim 12, wherein the base plate is made of copper and the substrate is made of aluminum.

14. The heat dissipation device of claim 13, wherein a top surface of the base plate and a bottom surface of the engaging plate of the substrate each define at least one groove for cooperatively receiving the evaporating section of the heat pipe.

15. The heat dissipation device of claim 14, wherein the evaporating section of the heat pipe has a substantially V-shaped configuration.

16. The heat dissipation device of claim 15, wherein the at least one groove in each of the top surface of the base plate and the bottom surface of the engaging plate is substantially V-shaped.

17. The heat dissipation device of claim 13, wherein the base plate is substantially rectangular in shape, consistent with that of the window of the substrate.

18. The heat dissipation device of claim 17, wherein the window of the frame body defines a recess in each corner thereof for allowing the condensing sections of the heat pipe to pass therethrough.

19. The heat dissipation device of claim 12, wherein the tabs of the clamping plates abut lateral sides of the fin set in the corresponding cutouts, the tabs being perpendicular to the corresponding clamping plates and being located above the substrate.

20. The heat dissipation device of claim 19, wherein the fin set has a plurality of flanges at the lateral sides of the fin set in the corresponding cutouts to engage the tabs of the clamping plates.

\* \* \* \* \*